United States Patent
Leon et al.

(10) Patent No.: US 6,191,086 B1
(45) Date of Patent: Feb. 20, 2001

(54) CLEANING COMPOSITION AND METHOD FOR REMOVING RESIDUES

(75) Inventors: Vincent G. Leon, Scottsdale, AZ (US); Kenji Honda, Barrington, RI (US); Eugene F. Rothgery, North Branford, CT (US)

(73) Assignee: Arch Specialty Chemicals, Inc., Norwalk, CT (US)

( * ) Notice: Under 35 U.S.C. 154(b), the term of this patent shall be extended for 0 days.

(21) Appl. No.: 09/464,485

(22) Filed: Dec. 15, 1999

Related U.S. Application Data

(60) Division of application No. 09/081,840, filed on May 19, 1998, now Pat. No. 6,030,932, which is a continuation-in-part of application No. 08/709,053, filed on Sep. 6, 1996, now Pat. No. 5,780,406.

(51) Int. Cl.$^7$ .............................. C11D 1/62; C11D 3/30; C11D 3/24

(52) U.S. Cl. .................. 510/175; 510/176; 510/178; 510/201; 510/202; 510/203; 510/204; 510/210; 510/212; 510/245; 510/254; 510/225; 510/256; 510/257; 510/259; 510/412; 510/477; 510/480; 510/504; 134/1.2; 134/1.3; 134/3; 134/22.14

(58) Field of Search .................. 510/175, 176, 510/178, 201, 202, 203, 204, 210, 212, 245, 254, 255, 256, 257, 259, 412, 477, 480, 304; 134/1.2, 1.3, 3, 22.14

(56) References Cited

U.S. PATENT DOCUMENTS

| | | | |
|---|---|---|---|
| 3,582,401 | 6/1971 | Berilla et al. | 134/3 |
| 3,888,783 * | 6/1975 | Rodzewich | 252/135 |
| 3,962,108 | 6/1976 | Perruccio | 252/142 |
| 4,015,986 | 4/1977 | Paal et al. | 96/36 |
| 4,169,068 | 9/1979 | Harita et al. | 252/143 |
| 4,215,005 * | 7/1980 | Vander May | 252/153 |
| 4,239,661 | 12/1980 | Muraoka et al. | 252/541 |
| 4,304,681 | 12/1981 | Martin et al. | 252/143 |
| 4,394,419 * | 7/1983 | Konicek | 428/416 |
| 4,395,348 | 7/1983 | Lee | 252/143 |
| 4,395,479 | 7/1983 | Ward et al. | 430/258 |
| 4,401,747 | 8/1983 | Ward, Jr. et al. | 430/258 |
| 4,401,748 | 8/1983 | Ward, Jr. et al. | 430/258 |
| 4,403,029 | 9/1983 | Ward, Jr. et al. | 430/258 |
| 4,428,871 | 1/1984 | Ward et al. | 252/542 |
| 4,617,251 | 10/1986 | Sizensky | 430/256 |
| 4,680,133 | 7/1987 | Ward | 252/153 |
| 4,770,713 | 9/1988 | Ward | 134/38 |
| 4,786,578 | 11/1988 | Neisius et al. | 430/256 |
| 4,791,043 | 12/1988 | Thomas et al. | 430/256 |
| 4,824,762 | 4/1989 | Kobayashi et al. | 430/258 |
| 4,824,763 | 4/1989 | Lee | 430/258 |
| 4,830,772 | 5/1989 | Van De Mark | 252/170 |
| 4,844,832 | 7/1989 | Kobayashi et al. | 252/143 |
| 4,885,047 * | 12/1989 | Ury et al. | 156/345 |
| 4,904,571 | 2/1990 | Miyashita et al. | 430/331 |
| 4,921,572 | 5/1990 | Roche | 216/99 |
| 4,944,893 | 7/1990 | Tanaka et al. | 252/171 |
| 4,971,715 | 11/1990 | Armant et al. | 252/143 |
| 4,992,108 | 2/1991 | Ward et al. | 134/38 |
| 5,091,103 | 2/1992 | Dean et al. | 252/162 |

(List continued on next page.)

FOREIGN PATENT DOCUMENTS

| | | |
|---|---|---|
| 3821231 | 1/1989 | (DE) . |
| 3828513 | 3/1990 | (DE) . |
| 0 647 884 A1 | 4/1995 | (EP) . |
| 56-115368 | 9/1981 | (JP) . |
| 63-050838 | 3/1988 | (JP) . |
| 63-208043 | 8/1988 | (JP) . |
| 89-013217 | 1/1989 | (JP) . |
| 1-042653 | 2/1989 | (JP) . |
| 1-081949 | 3/1989 | (JP) . |
| 1-081950 | 3/1989 | (JP) . |
| 1-088548 | 4/1989 | (JP) . |
| 1-114846 | 5/1989 | (JP) . |
| 1-133049 | 5/1989 | (JP) . |
| 2-048668 | 2/1990 | (JP) . |
| 2-131239 | 5/1990 | (JP) . |
| 2-253265 | 10/1990 | (JP) . |
| 4-124668 | 4/1992 | (JP) . |
| 5-045894 | 2/1993 | (JP) . |
| 93-024498 | 2/1993 | (JP) . |
| 4-350660 | 11/1993 | (JP) . |
| 7-028254 | 1/1995 | (JP) . |
| 7-244386 | 9/1995 | (JP) . |
| 7-271056 | 10/1995 | (JP) . |
| WO 8805813 | 8/1988 | (WO) . |

OTHER PUBLICATIONS

"Development Of Advanced Corrosion Free Organic Strippers For ULSI Processing" by A.L.P. Rotondaro, K. Honda, T. Maw, D. Perry, M. Lux, M.M. Heyns. C. Claeys and I. Daraktchiev, appearing at Fourth International Symposium On Cleaning Technology In Semiconductor Device Manufacturing, Oct. 1995, Chicago, Illinois.

"Investigation Of Advanced Organic Strippers For ULSI Processing" by A.L.P. Rotondaro, R.M. Gluck, M. Meuris, M.M. Heyns C. Claeys, K. Honda and I. Daraktchiev for presentation at Interfface 94, Nov. 1994, San Diego, CA.

"Thin Film Pitting: Is NMP the Culprit?", by Dr. Franco T. Lee, Dr. David R. Wanlass and B. Walsh, appearing in Semiconductor International, Jun. 1994.

*Primary Examiner*—Yogendra Gupta
*Assistant Examiner*—Charles Boyer
(74) *Attorney, Agent, or Firm*—Ohlandt, Greeley, Ruggiero & Perle, L.L.P.

(57) ABSTRACT

Non-corrosive cleaning compositions that are aqueous based and useful for removing photoresist, plasma etch and CMP residues from a substrate. One preferred cleaning composition comprises: (i) a hydroxylamine or a hydroxylamine salt compound; (ii) at least one fluorine-containing compound; and (iii) water. Another cleaning composition comprises: (i) a compound selected from the group consisting of: an amine, a quaternary ammonium hydroxide, and ammonium hydroxide; (ii) at least one fluorine-containing compound; and (iii) water.

6 Claims, No Drawings

U.S. PATENT DOCUMENTS

| | | | |
|---|---|---|---|
| 5,102,777 | 4/1992 | Lin et al. | 430/331 |
| 5,114,834 | 5/1992 | Nachshon | 430/329 |
| 5,139,607 | 8/1992 | Ward et al. | 156/655 |
| 5,145,717 | 9/1992 | Drury | 427/96 |
| 5,174,816 | 12/1992 | Aoyama et al. | 106/203 |
| 5,185,235 | 2/1993 | Sato et al. | 430/331 |
| 5,279,771 | 1/1994 | Lee | 252/548 |
| 5,308,745 | 5/1994 | Schwartzkopf | 430/329 |
| 5,320,709 | 6/1994 | Bowden et al. | 438/745 |
| 5,334,332 | 8/1994 | Lee | 252/548 |
| 5,381,807 | 1/1995 | Lee . | |
| 5,417,802 | 5/1995 | Osbeng | 216/13 |
| 5,419,779 | 5/1995 | Ward | 134/38 |
| 5,421,906 * | 6/1995 | Borah | 134/26 |
| 5,464,480 * | 11/1995 | Matthews | 134/1.3 |
| 5,472,830 | 12/1995 | Honda | 430/331 |
| 5,478,436 | 12/1995 | Winebarger et al. | 438/693 |
| 5,480,585 | 1/1996 | Shiotsu et al. | 252/544 |
| 5,482,566 | 1/1996 | Lee | 134/42 |
| 5,496,491 | 3/1996 | Ward et al. | 252/153 |
| 5,507,978 | 4/1996 | Honda | 252/544 |
| 5,509,970 * | 4/1996 | Shiramizu | 134/3 |
| 5,541,037 * | 7/1996 | Hatakeyama et al. | 430/273.1 |
| 5,567,574 | 10/1996 | Hasemi et al. | 430/331 |
| 5,630,904 | 5/1997 | Aoyama et al. | 438/669 |
| 5,709,756 * | 1/1998 | Ward et al. | 134/1.3 |
| 5,792,274 * | 8/1998 | Tanabe et al. | 134/1.3 |
| 5,824,604 * | 10/1998 | Bar-Gadda | 438/725 |
| 5,837,662 * | 11/1998 | Chai et al. | 510/175 |
| 5,855,811 * | 1/1999 | Grieger et al. | 252/79.3 |
| 5,925,577 * | 7/1999 | Solis | 438/725 |
| 5,939,618 * | 8/1999 | Hu et al. | 73/40 |
| 5,964,953 * | 10/1999 | Mettifogo | 134/2 |
| 6,009,888 * | 1/2000 | Ye et al. | 134/1.3 |
| 6,017,827 * | 1/2000 | Morgan et al. | 438/745 |

* cited by examiner

CLEANING COMPOSITION AND METHOD FOR REMOVING RESIDUES

This is a division of U.S. patent application Ser. No. 09/081,840 filed May 19, 1998 and allowed Sep. 29, 1999, now U.S. Pat. No. 6,030,932 which is a Continuation-In-Part of U.S. patent application Ser. No. 08/709,053, filed Sep. 6, 1996, which issued as U.S. Pat. No. 5,780,406, on Jul. 14, 1998.

BACKGROUND OF THE INVENTION

1. Field of the Invention

This invention relates to a cleaning composition and method for use in microelectronics manufacturing, and more particularly to a non-corrosive cleaning composition and method for removing photoresist, plasma etch and chemical-mechanical polishing (CMP) residues on substrates.

2. Description of Art

In the manufacture of microcircuits, positive photoresists are used as an intermediate mask for transferring an original mask pattern of a reticule onto wafer substrates by means of a series of photolithography and plasma etching steps. One of the steps in the microcircuit manufacturing process is the removal of the patterned photoresist films from the substrates. In general, this step is affected by one of two methods. One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly cross-linked by such treatments and are more difficult to dissolve in the stripper solution. In addition, the chemicals used in these conventional wet stripping methods are sometimes ineffective for removing inorganic residual materials formed during the plasma etching of metal or oxide layers with halogen-containing gases.

An alternative method of removing a photoresist film involves exposing a photoresist-coated wafer to oxygen plasma in order to burn the resist film from the substrate surface in a process known as oxygen plasma ashing. Oxygen plasma ashing has become more popular in the microcircuit manufacturing process because it is carried out in a vacuum chamber and, hence, is expected to be less susceptible to airborne particulate or metallic contamination. However, oxygen plasma ashing is also not fully effective in removing plasma etching residues noted above. Instead, removal of these plasma etching residues must be accomplished by subsequently exposing the photoresist film to certain alkaline solutions. Several commercial products are now available to clean the plasma etching residues left by plasma etching followed by oxygen ashing. For example, EKC 265, available from EKC Technology, Inc., is a plasma etching cleaning solution composed of water, alkanolamine, catechol and hydroxylamine. Such a composition is disclosed in U.S. Pat. No. 5,279,771 to Lee. ACT 935, available from Ashland Chemical, is another plasma etching cleaning solution and is composed of water, alkanolamine and hydroxylamine. In both cases, hydroxylamine is used as a corrosion inhibitor. R-10, a post-strip rinse available from Mitsubishi Gas Chemical, is composed of water, alkanolamine and a sugar alcohol, wherein the sugar alcohol acts as a corrosion inhibitor.

Although these commercial products can effectively dissolve plasma etching residues, the combination of water and alkanolamine contained therein can also attack the metallic layers deposited patternwise on the substrate. The addition of a corrosion inhibitor to these products can mitigate to a certain extent, the unwanted attack on the metallic layers and oxide layers deposited on the substrate. However, since these products have a pH above 11, even in the presence of a corrosion inhibitor, they may attack certain corrosion-sensitive metal layers. Particularly, metal layers such as aluminum or aluminum alloys (e.g., Al—Cu—Si), titanium nitride, titanium tungsten and the like are particularly corrosion sensitive. Furthermore, while the addition of a suitable corrosion inhibitor is essential to prevent corrosion of the substrate metal layers, the corrosion inhibitor must not inhibit the removal of the plasma etching residue.

It is difficult to balance effective plasma etching residue removal and corrosion inhibition because chemical compositions of the plasma etching residues are generally similar to those of the metal layers or oxide layers on the substrate. The alkanolamine used in the prior art cleaning compositions was oftentimes found to attack both the plasma etching residue and the substrate metal layers. Moreover, if a post-cleaner rinse such as isopropyl alcohol was not used, the corrosion could be very severe. In addition, some types of the corrosion inhibitors have been found to retard plasma etching residue removal. There has also always been a tradeoff between speed of plasma etching residue removal and substrate metal layer corrosion inhibition. Accordingly, there has remained a need for a method of quickly and effectively removing the plasma etching residues without causing metal layer corrosion.

Several other patents in the photoresist stripper/cleaner application field exist as follows, although none of them disclose the use of the method or compositions of the present invention:

Japanese Patent Application No. 7-028254, assigned to Kanto Kagaku, discloses a noncorrosive resist removal liquid comprising a sugar alcohol, an alcohol amine, water, and a quaternary ammonium hydroxide.

PCT Published Patent Application No. WO 88-05813 teaches a positive or negative photoresist stripper containing butyrolactone or caprolactone, quaternary ammonium hydroxide compound, and optionally, a nonionic surfactant.

U.S. Pat. No. 4,239,661 to Muraoka et al. discloses a surface-treating agent comprising an aqueous solution of 0.01% to 20% trialkyl (hydroxyalkyl) ammonium hydroxide. This agent is useful in removing organic and inorganic contaminants deposited on the surface of intermediate semiconductor products.

U.S. Pat. No. 4,904,571 to Miyashita et al. teaches printed circuit board photoresist stripper composition containing a solvent (e.g., water, alcohols, ethers, ketones, and the like), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing: (A) N-alkyl-2-pyrrolidone; (B) 1,2-propanediol; and (C) tetraalkylammonium hydroxide.

U.S. Pat. No. 5,139,607 to Ward et al. teaches positive and negative photoresist stripping composition containing: (A) tetrahydrofurfuryl alcohol; (B) a polyhydric alcohol (e.g., ethylene glycol or propylene glycol); (C) the reaction product of furfuryl alcohol and an alkylene oxide; (D) a water-soluble Bronstead base type hydroxide compound (e.g., alkali metal hydroxide, ammonium hydroxide and tetramethyl ammonium hydroxide); and (E) water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, which composition comprises an aqueous solution containing 0.01 to 15% by weight of a quaternary ammonium hydroxide, such as trimethyl (2-hydroxyethyl) ammonium hydroxide, and 0.1 to 20% by weight of sugar or sugar alcohol, such as xylitol, mannose, glucose and the like.

In addition to photoresist and plasma etch removal, another step that is widely used in the manufacturing of microcircuits includes a planarization process such as planarization etch back or chemical-mechanical polishing (CMP). A planarization process is needed in microcircuit manufacturing because the deposition of successive layers of materials on the substrate causes the surface to becomes uneven and it is difficult to lithographically print images over the uneven topography. The planarization process evens the surface making it easier to form an image thereon by lithographic printing.

In planarization etch back, a planarizing material, such as a polymer resist or a spin on glass (SOG) containing $SiO_2$ is typically spun on the uneven topography to planarize the substrate. The substrate is then subjected to a plasma etch process wherein the planarizing material and underlying substrate are etched at approximately the same rate to form a planar surface. With this process, the plasma etch residues and portions of the planarizing material typically remain on the substrate and must be removed.

In the CMP process, the surface that is to be planarized is brought into contact with a rotating polishing pad in the presence of an abrasive slurry. A portion of the surface layer of the substrate is removed by the chemical nature of the slurry and the abrasive action of the polishing pad. The problem with CMP is that residues are left behind on the substrate, either from the slurry that is used in the CMP process or from detached substrate material. These residues can contaminate the vias, and deleteriously affect the workings of the microcircuit. Especially severe contaminants to microcircuits are residues from the polishing slurry which contain metal contaminants including alkaline metals such as sodium, potassium, and the like, and iron.

The CMP contaminates are typically removed from the substrate surface by contacting the surface with a caustic solution containing ammonium hydroxide or ammonium hydroxide mixed with hydrogen peroxide. In addition, brush scrubbing with these solutions has also been used to remove particulate matter. However, these caustic solutions can diffuse through defects in the substrate and attack the metal layers such as aluminum, aluminum alloys, refractory metals, and the like. The metal attack may subsequently cause voids in the metal that can lead to failure of the microcircuit.

Several patents describe attempts of solving the problem of metal attack using the combination of a specific organic corrosion inhibitors and a fluorine-containing compound. For example, U.S. Pat. No. 5,478,4436 to Winebarger et al, uses a combination of an organic corrosion inhibitor (glycol and dimethylsulfoxide) and fluorine-containing compounds such as ammonium fluoride, hydrogen fluoride and perfluoric acid. U.S. Pat. No. 5,320,709 to Bowden et. al. discloses the use of an anhydrous ammonium fluoride salt in polyhydric alcohol. The problem with these compositions is that organic solvents are only weak corrosion inhibitors, and a high concentration of organic solvent (greater than 50% by weight) is required. Thus, there is a problem with waste removal since the organic-based cleaning solution is environmentally unfriendly.

Therefore, there remains a need for a composition that removes photoresist, plasma etch, and CMP residues from substrates. Additionally, there remains a need for such a composition that does not deleteriously affect the substrate. Further, there remains a need for such a composition that is aqueous-based so that the disposal thereof will not harm the environment.

SUMMARY OF THE INVENTION

The present invention is, in brief summary, directed to a non-corrosive cleaning composition that is aqueous based and useful for removing photoresist, plasma etch and CMP residues from a substrate. The composition comprises:

(i) a hydroxylamine or a hydroxylamine salt compound;

(ii) at least one fluorine-containing compound; and (iii) water.

In an alternative embodiment, this invention contemplates a cleaning composition comprising:

(i) a compound selected from the group consisting of an amine, a quaternary ammonium hydroxide and ammonium hydroxide;

(ii) at least one fluorine-containing compound; and (iii) water.

The invention further contemplates a method of removing residues from a substrate comprising the steps of contacting a substrate containing residues with at least one of the above mentioned cleaning compositions.

DETAILED DESCRIPTION OF THE PREFERRED EMBODIMENT

A non-corrosive cleaning composition that is useful for removing photoresist, plasma etch and CMP residues from a substrate. The composition preferably comprises:

(i) a hydroxylamine or a hydroxylamine salt compound;

(ii) at least one fluorine-containing compound; and (iii) water.

The composition can contain either hydroxylamine or a salt of the hydroxylamine produced by reacting the hydroxylamine with an acid, e.g., nitric acid or sulfuric acid. Preferred hydroxylamine salts that can be used to form the cleaning composition of the present invention include hydroxylammonium nitrate (also referred to as HAN), hydroxylammonium sulfate (also referred to as HAS), hydroxylammonium phosphate, hydroxylammoniun chloride, hydroxylammonium oxalate, hydroxylammonium citrate, and the like. Alkyl-substituted derivatives of hydroxylammonium salts are also useful; e.g., hydroxyl diethylammonium salts and the like.

The fluorine-containing compound in the above composition can be selected from acid fluorides, fluorinated salts, polyammonium fluoride salts and mixtures thereof. Preferred acid fluorides include hydrogen fluoride, (HF), and perfluoric acid. Preferred fluoride salts are ammonium fluoride, ammonium bifluoride, ammonium difluoride and tetraalkyl ammonium fluoride salts such as tetramethyl ammonium fluoride and tetraethyl ammonium fluoride. Preferably, the fluorine-containing compound will comprise about 0.5 to 10 wt. % based upon the weight of the composition.

The polyammonium salts may be prepared by reacting a polyamine with HF to form the polyammonium fluoride salt. For example, HF may be reacted with an aqueous solution of ethylene diamine to form an ethylenediammonium difluoride. Alternatively, an excess amount of HF may be reacted with the polyamine to form the polyammonium salt. Preferred polyammonium salts include ethylenediammonium difluoride and diethylenetriammonium trifluoride.

It is believed that the fluorine-containing compound aids in removal of contaminates by slightly etching the underlying silicon-based substrate so that any contaminates on the surface or embedded in the substrate are removed. Also, it is believed that many of the plasma etch residues, especially those containing fluoride species, are soluble in fluorine solutions and will also be removed. Hydroxylamines and salts thereof act as corrosion inhibitors and aid in the removal of residues. Thus, the combination of a fluorine compound and a hydroxylamine or hydroxylamine salt has been found by the present applicants to be particularly useful as a cleaning composition.

The pH of the cleaning composition preferably ranges from weakly acidic to slightly basic so as to not attack or corrode the metal used in the microcircuit fabrication. If the cleaning composition is either too caustic or too acidic, the metal layers on the substrate are subject to attack. Therefore, the components in the cleaning composition should be admixed in appropriate concentrations to provide a composition having a pH with a preferred range from about 2 to 9, and more preferably from about 2 to 6.

In a preferred embodiment of this invention, the fluorine-containing compound is admixed with a composition comprising water, a hydroxylamine salt and at least one basic compound selected from the group consisting of: amines, quaternary ammonium hydroxides and ammonium hydroxide. Such compositions are described in copending U.S. patent application Ser. No. 08/709,053, filed Sep. 6, 1996, the subject matter of which is incorporated herein by reference.

Amines that may be used as a component in the cleaning compositions include alkanolamines such as monoethanolamine, diethanolamine, triethanolamine, diethyleneglycolamine, N-hydroxylethylpiperazine, and the like. Quaternary ammonium hydroxides that can be used in the compositions include tetraalkylammonium hydroxides having methyl, ethyl propyl, butyl hydroxyethyl, and the combinations thereof (e.g., tetramethylammonium hydroxide (hereafter referred to as TMAH), tetraethylammonium hydroxide, trimethyl hydroxyethylammonium hydroxide, methyl tri (hydroxyethyl) ammonium hydroxide, tetra (hydroxyethyl) ammonium hydroxide, benzyl trimethylammonium hydroxide and the like). Additionally, a combination of ammonium hydroxide with one or more quaternary ammonium hydroxides may also be used. Preferably, the hydroxylamine salt will comprise about 1% to 70% by weight, the base compound will comprise about 0.1% to 10% by weight, and water will comprise the remainder of the composition, these weight percentages being based on the total combined weight of hydroxylamine salt, basic compound and water (excluding the weight of the fluorine-containing compounds and other optional components of the cleaning composition).

A chelating stabilizer may be optionally included in the cleaning composition to stabilize the hydroxylamine salts. Suitable chelating stabilizers include triethylenetetramine (hereinafter referred to as TETA); 2,2'-[[methyl-1H-benzotriazol-1-yl)methyl]imino]bisethanol (Tradename is IRGAMET 42), (2-benzothiazolythio)succinic acid (Tradename is IRGACOR 252), tricine, bicine, and other water-soluble chelating compounds. Preferably, the stabilizer is present in the composition of the invention in the range of about 5 ppm to about 5000 ppm by weight based on the a total weight of cleaning composition.

A surfactant may also be optionally included in the cleaning composition so as to enhance the power of the plasma etching residue removal from the substrate. Suitable surfactants are selected from nonionic types, cationic types and anionic types of surfactants. Preferably, a surfactant is present in the composition of the invention in the range of about 0.1 ppm to 100 ppm by weight to a total weight of the cleaning composition. The cleaning composition may also, optionally, contain a minor amount of a corrosion inhibitor such as sugar alcohols, catechol and the like.

Another optional agent that may be included in the cleaning composition is a corrosion inhibitor. The preferred corrosion inhibitors are lactic acid, salicyl alcohol, salicyl aldoxime, gallic acid, gallic acid esters and alizarin.

This invention also contemplates a cleaning composition comprising:
(i) at least one compound selected from the group consisting of: an amine, a quaternary ammonium hydroxide, and ammonium hydroxide;
(ii) at least one fluorine-containing compound; and
(iii) water.

The quaternary ammonium hydroxide and fluorine-containing compounds are the same as those described previously in this invention. It is believed that the quaternary ammonium hydroxides are used to remove photoresist residues; while the fluorine-containing compound solublizes fluorine-containing plasma etch residues and slightly etches the substrate to remove particles on the surface and embedded in the substrate. Other components may also be added in the cleaning composition such as chelating agents, surfactants and corrosion inhibitors as were previously described above.

The pH of the above cleaning composition may range anywhere from weakly acidic to slightly basic so as to not attack or corrode the metal used in the microcircuit fabrication. Therefore, the components in the cleaning composition should be admixed in appropriate concentrations to maintain the pH range from about 2 to 9.

This invention further contemplates the method of removing residues from a substrate comprising the steps of:
applying one of the above mentioned cleaning solutions to the substrate containing residues.

The cleaning method of the present invention can also be used in combination with a dry stripping process if photoresist or other polymer residues remain on the surface. Dry stripping is typically conducted prior to the present cleaning method. Any suitable dry stripping process can be used including $O_2$ plasma ashing, ozone gas phase-treatment, fluorine plasma treatment, hot $H_2$ gas treatment (described in U.S. Pat. No. 5,691,117), and the like. The preferred dry stripping process is $O_2$ plasma ashing.

Furthermore, the cleaning method can also be used in combination with ozonated water which is used to strip off photoresist and other residues. The ozonated water can be a simple mixture of ozone and ultra-pure water, e.g., DI water. The ozone can be generated by any conventional means, e.g., an ozone generator. The mixing of the ozone and water may be achieved by any suitable method, such as jetting the ozone into the water by a gas feed nozzle; feeding the water and ozone into a spiral mixer, aspirating the gas into the flow of water, and feeding the ozone into a treatment tank regulated at a given pressure so that ozone is dissolved into the water. The ozonated water can then be contacted with the substrate by any stable method such as placing the ozonated water into a tank and submerging the substrates into the ozonated water, or by use of a spray rinse.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for removing residues from a substrate comprising the step of contacting a residue-containing substrate with a cleaning composition comprising (i) a hydroxylamine salt compound selected from the group consisting of hydroxylammonium sulfate, hydroxylammonium nitrate, hydroxylammonium phosphate, hydroxylammonium oxalate, hydroxylammonium citrate, and hydroxylammonium chloride; (ii) at least one fluorine-containing compound; and (iii) water.

2. The method of claim 1, further comprising a step of subjecting said substrate to dry stripping.

3. The method of claim 1 further comprising the step of contacting said substrate with ozonated water.

4. A method for removing residues from a substrate comprising the step of contacting a residue-containing substrate with a cleaning composition comprising (i) a compound selected from the group consisting of: trimethyl hydroxyethylammonium hydroxide, methyl tri(hydroxyethyl) ammonium hydroxide, tetra(hydroxyethyl) ammonium hydroxide, diethylene glycolamine, and N-hydroxylethylpiperazine; (ii) at least one fluorine-containing compound; and (iii) water.

5. The method of claim 4 further comprising a step of subjecting said substrate to dry stripping.

6. The method of claim 4 further comprising the step of contacting said substrate with ozonated water.

* * * * *